United States Patent
Raab

(10) Patent No.: US 7,609,744 B2
(45) Date of Patent: Oct. 27, 2009

(54) LASER RESONATOR COMPRISING AN INTERNAL BEAM SPLITTER

(76) Inventor: Volker Raab, Amundsenstr. 10, 14469 Potsdam (DE)

( * ) Notice: Subject to any disclaimer, the term of this patent is extended or adjusted under 35 U.S.C. 154(b) by 340 days.

(21) Appl. No.: 11/789,720

(22) Filed: Apr. 25, 2007

(65) Prior Publication Data

US 2008/0165821 A1    Jul. 10, 2008

Related U.S. Application Data

(63) Continuation-in-part of application No. PCT/DE2005/001959, filed on Oct. 28, 2005.

(30) Foreign Application Priority Data

Oct. 29, 2004    (DE) ................ 10 2004 053 136

(51) Int. Cl.
    *H01S 3/08* (2006.01)
(52) U.S. Cl. ........................... 372/96; 372/94
(58) Field of Classification Search ........... 372/22, 372/12, 94; 385/49, 147; 398/81
    See application file for complete search history.

(56) References Cited

U.S. PATENT DOCUMENTS

| | | | | |
|---|---|---|---|---|
| 5,142,542 | A | * | 8/1992 | Dixon ........................ 372/22 |
| 5,930,283 | A | * | 7/1999 | Imai et al. .................. 372/94 |
| 6,005,878 | A | * | 12/1999 | Kung et al. ................. 372/22 |
| 6,414,973 | B1 | * | 7/2002 | Hwu et al. .................. 372/19 |

* cited by examiner

*Primary Examiner*—Minsun Harvey
*Assistant Examiner*—Tuan N. Nguyen
(74) *Attorney, Agent, or Firm*—R.S. Lombard; K. Bach

(57) ABSTRACT

A simple and compact laser resonator is proposed which makes it possible to symmetrically operate a gain medium, preferably a semiconductor, which possesses more than one channel of emission. As a result higher output powers and/or better beam qualities and/or better spectral characteristics can be achieved. The resonator is very compact and ideally comprises only three optical elements: a laseractive gain medium (1), a cylindrical collimation lens (5), and a prism (6) which is adapted to the angle between the two emissions (4) and which carries a beam splitter (7) and a feedback mirror (9) on its faces. Preferably the gain medium (1) possesses a feedback element (2) and an antireflective coating (3) on its faces. If no antireflective coating (11) is desired the same effect can be achieved by arranging the angle of incidence to fulfill the Brewster-condition. In a preferred embodiment the gain medium (1) is a high-power diode laser chip with an internal stripe-array and/or the laser resonator is unstable along the direction parallel to the epitaxial layers. In alternative embodiments the feedback element (9) is wavelength selective like a grating, a dielectric filter, a holographic element or a volume Bragg grating.

15 Claims, 6 Drawing Sheets

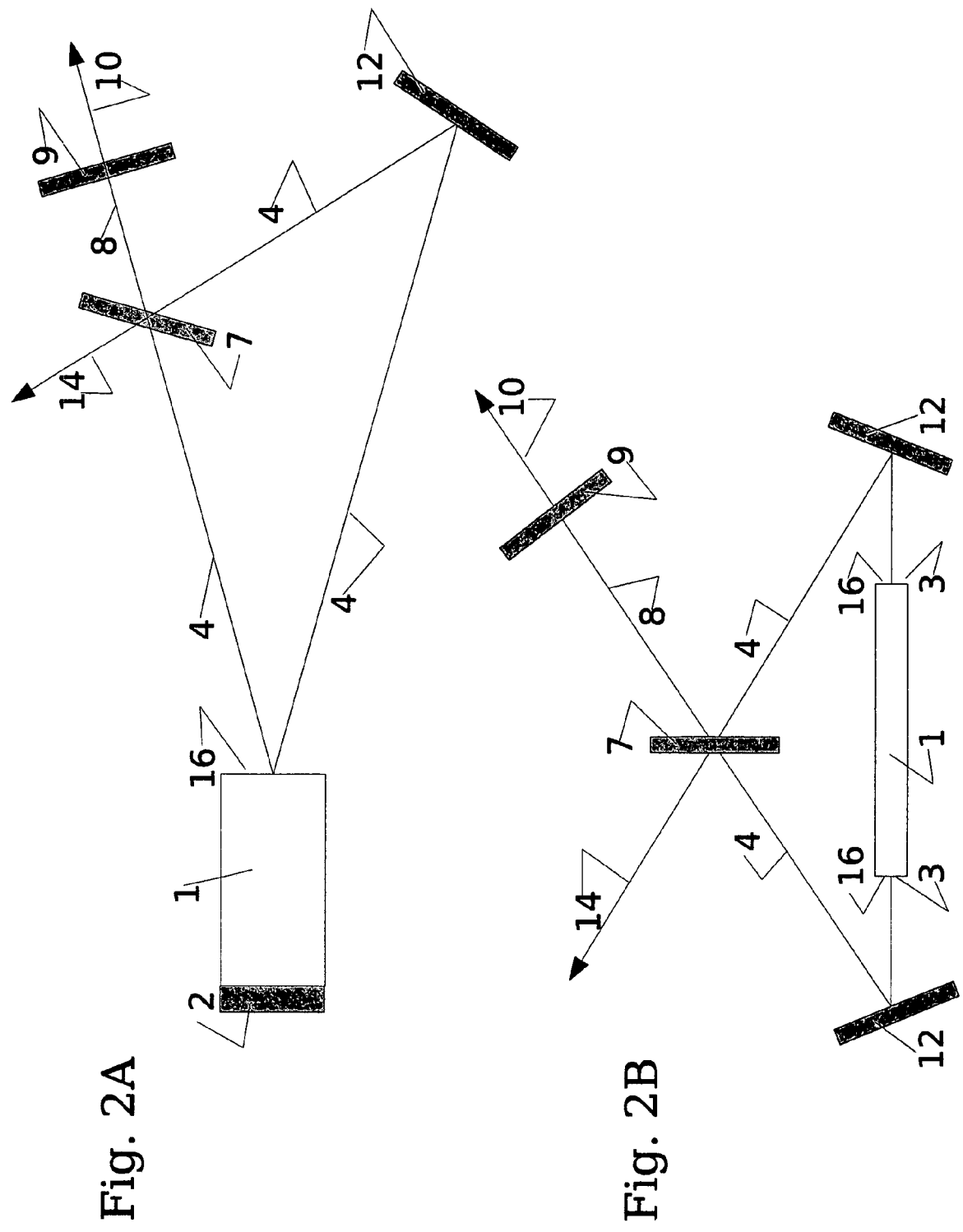

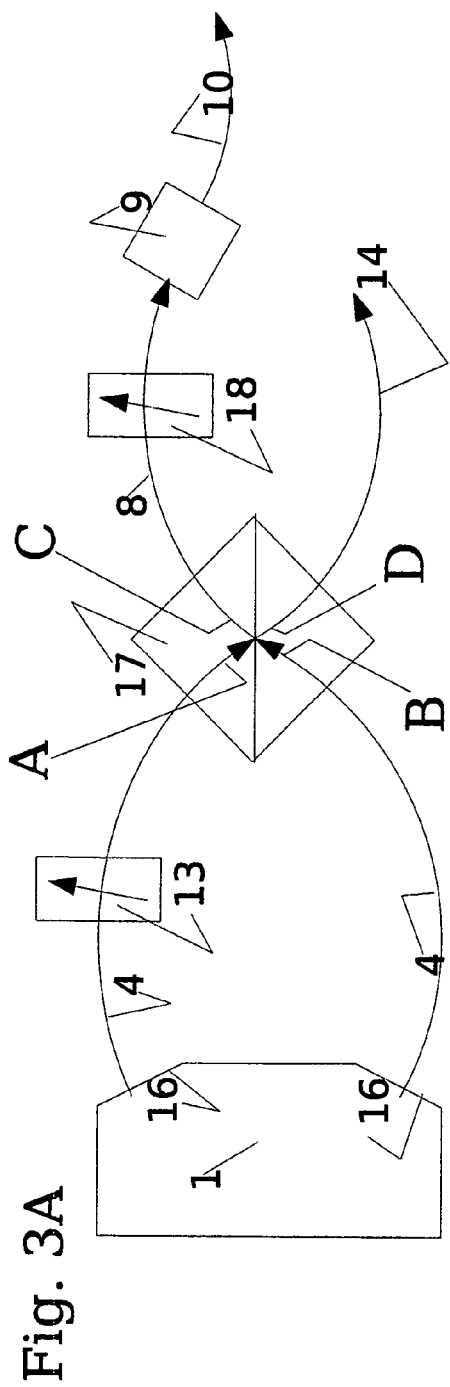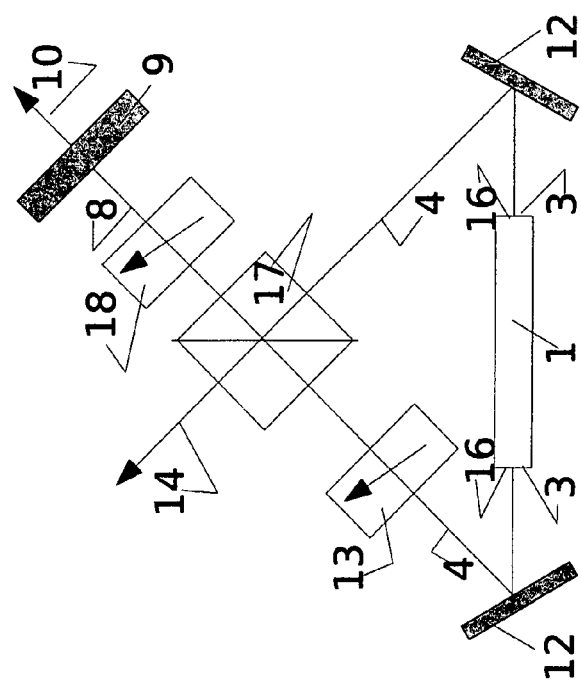
Fig. 3A
Fig. 3B

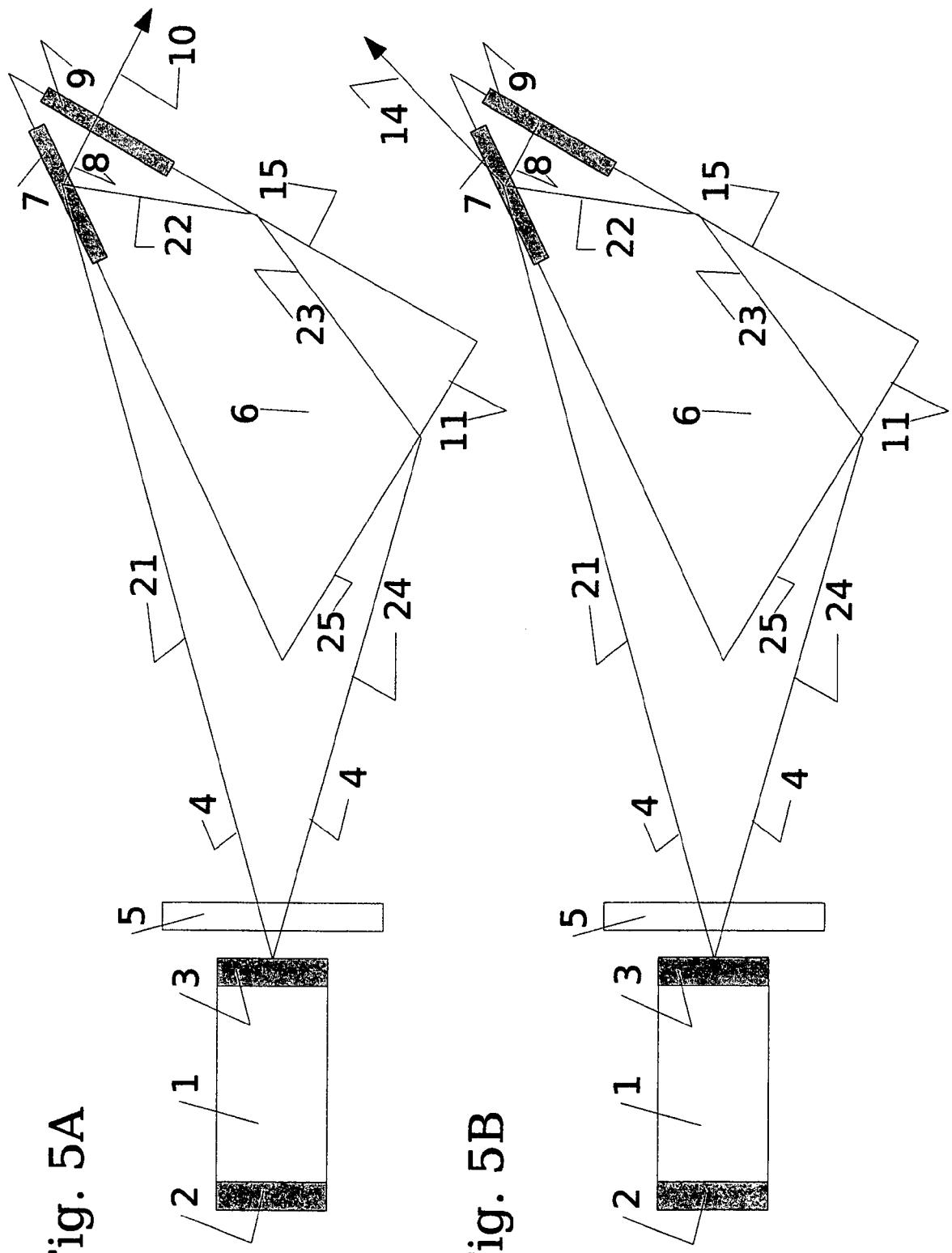

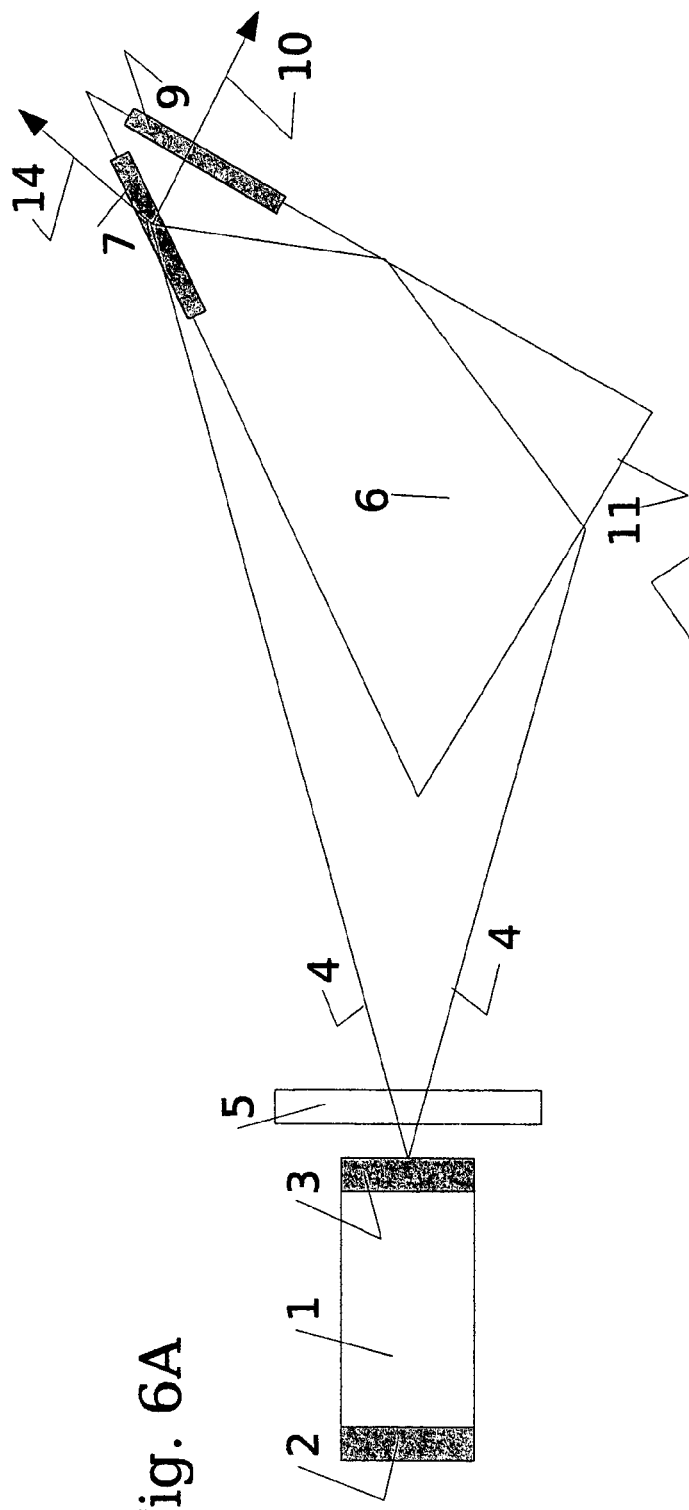
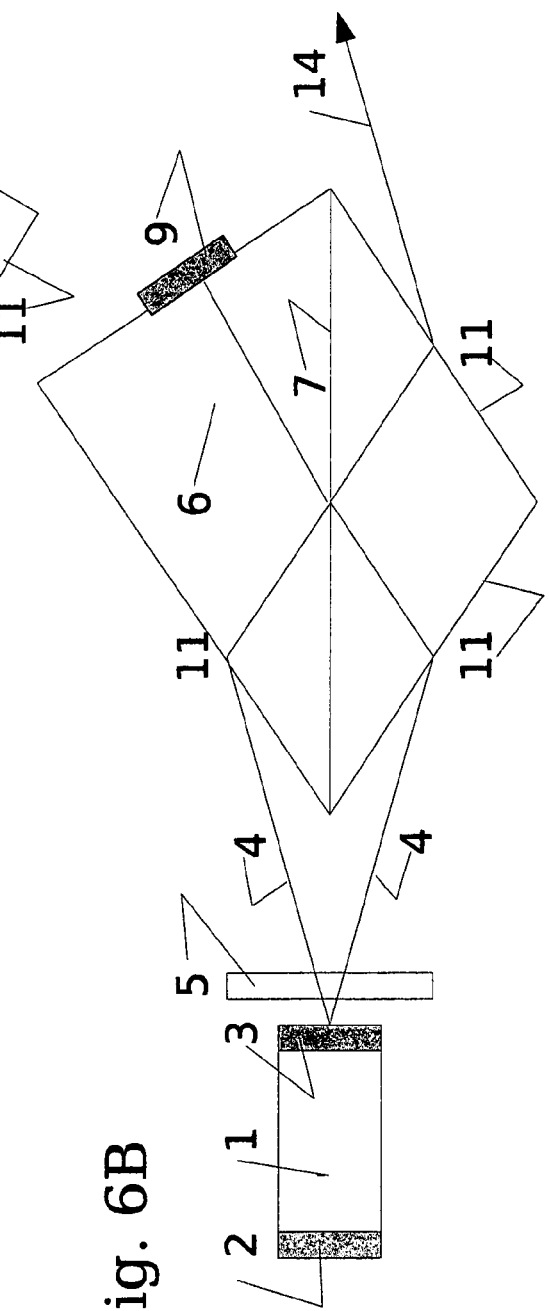

LASER RESONATOR COMPRISING AN INTERNAL BEAM SPLITTER

CROSS-REFERENCE TO RELATED APPLICATION

This is a continuation-in-part application of international application PCT/DE2005/001959 filed Oct. 28, 2005 and claiming the priority of German application 10 2004 053 136.6 filed Oct. 29, 2004.

BACKGROUND OF THE INVENTION

Each laser comprises a laser active region called gain in which the supplied energy is converted to coherent radiation by means of stimulated emission. On this behalf an optical resonator is necessary which re-injects part of the radiation back into the gain region. This resonator comprises at least one feedback element, typically a semitransparent mirror. The resonator determines the physical characteristics of the laser radiation by means of its geometry and feedback characteristics. The most prominent radiation characteristics are the spatial profile, the wavelength, and the polarization. The achievable parameters strongly depend on the gain material and the resonator and are usually inversely correlated with each other and the achievable output power. Improving single parameters generally deteriorates others. Generally speaking all losses and not usable emission of light is harmful for the overall performance.

Semiconductor lasers are of outstanding practical importance because they are small and cheap. They directly convert electrical power into light, they have a high conversion efficiency, and they can be produced in large quantities by means of well established techniques of semiconductor technology. In those devices the optical resonator is usually integrated by means of dielectric reflecting coatings on the outcoupling facets or by means of epitaxially integrated refractive index gratings. However, presently the maximum achievable output power or the power density, respectively, is way too low for numerous applications. This is due to the fact that the generation of light takes place in a volume smaller than 1 mm$^3$. On increasing the pump powers the resulting optical power densities would destroy the device. The apparent solution to increase the active volume is practically limited because the modal selectivity of the resonator decreases and the beam quality deteriorates correspondingly. Neither does it help much to introduce substructures into the gain material as disclosed in German publications DE 43 38 606 and DE 36 11 167.

Therefore it has been pursued with semiconductor lasers to separate the resonator off of the gain. In other words the semiconductor gain material is inserted into an external optical resonator. By this a drastic increase in power density could be achieved as disclosed in the following publications: DE 101 61 076, WO 02/21651, WO 02/082593, WO 98/56087, U.S. Pat. No. 4,426,707, Opt. Lett. 27(3) pp. 167-169. All these publications have in common that the emission of the semiconductor is separated into two angular regions out of which one serves as feedback branch and the other one is coupled out to extract the usable light.

External resonators for high-power diode-lasers according to the prior art use a certain direction of emission of radiation which emanates from the gain material exclusively for feedback and a different direction of emission exclusively for extracting usable light. The fraction of radiation that is emitted towards the feedback cannot be influenced and, therefore, is too high or too low as compared to the optimal amount. If the fraction towards the feedback is too high, that is it is above the saturation, the output power lacks this excess power. But if it is too low then the beam quality and side mode suppression suffer. Also the fraction of incoherently emitted light, the so-called amplified spontaneous emission, increases. And in any case the power flux inside the gain is distributed very asymmetrically between feedback and outcoupling branch.

The present invention is directed to providing setups or arrangements which allow for a freely selectable distribution between feedback and outcoupling and an optimizable degree of feedback. It needs to be possible to symmetrize the two channels and adjust feedback.

SUMMARY OF THE INVENTION

A simple and compact laser resonator is provided by the present invention which makes it possible to symmetrically operate a gain medium, preferably a semiconductor, which possesses more than one channel of emission. As a result higher output powers and/or better beam qualities and/or better spectral characteristics can be achieved.

The resonator is very compact and ideally comprises only three optical elements: a laseractive gain medium (1), a cylindrical collimation lens (5), and a prism (6) which is adapted to the angle between the two emissions (4) and which carries a beam splitter (7) and a feedback mirror (9) on its faces. Preferably the gain medium (1) possesses a feedback element (2) and an antireflective coating (3) on its faces. If no antireflective coating (11) is desired the same effect can be achieved by arranging the angle of incidence to fulfill the Brewster-condition.

The reflectivities of splitter (7) and feedback mirror (9) determine the relative optical power in the beams (10) and (14). If the mixing beam splitter has 50% reflectivity then both feedback branches (4) carry the same amount of power and beam (14) can nearly disappear. If the mixer has a reflectivity away from 50% usually a beam (14) exists. Then it can be advantageous to suppress beam (10) by means of a high reflectivity of feedback element (9). In a preferred embodiment the gain is a high-power diode laser chip with an internal stripe-array and/or the laser resonator is unstable along the direction parallel to the epitaxial layers. In alternative embodiments the feedback element (9) is wavelength selective like a grating, a dielectric filter, a holographic element or a volume Bragg grating.

The principal aspect of the present invention is to introduce a mixer between the two channels of feedback and outcoupling into the resonator. Preferably this mixer is adjustable. This can be done by inserting one or more beam splitters between the gain and the feedback element which distributes the feedback light between the various channels of emission of the gain. By choosing a suitable splitting ratio for the mixer each fraction of power can be chosen at will. At least one feedback element, typically also a beam-splitting semitransparent mirror, serves for feedback so that the overall feedback-ratio can be varied externally to achieve an optimum.

As opposed to the prior art in which internal beam splitters were used, here the splitter never connects different directions of emission of the gain directly but only via the feedback element. The following fundamental differences are noteworthy:

The beam splitter is inserted such that it forwards at least part of the light of at least two directions of emission towards the feedback element;

This setup is not a ring resonator as it does not possess circulating light. A ring resonator is generally chosen if traveling waves inside the gain are desirable to avoid spatial hole burning. This necessitates means like Faraday-isolators, polarization losses, or feedback arrangements to almost completely suppress one direction of circulation or emission. In the proposed invention it can hardly be spoken of ring resonators because the opposite is sought for: it is explicitly desired to have at least two directions of emission active. So after all it is rather still like a linear resonator—despite the fact that it contains a loop—with more than one arm in which the power content of the different arms is mixed to have access to the relative fractions of power in them. In many arrangements a symmetric power distribution is desired which can be achieved hereby;

The beam splitter is inserted such that all emissions from the gain exclusively travel towards the outcoupling channels or the feedback elements. No part of the light out of the gain may return without passage of the beam splitter and the feedback element if optimal feedback according to this arrangement is sought for;

Light that returns from the feedback towards the beam splitter is distributed onto the different angles of emission irrespective of where it originated from. This is an apparent difference to most arrangements with a polarizing beam splitter because the polarizer is generally used to explicitly select certain fractions of the light or certain directions of emission;

Without the said mixer element and/or feedback element no laser activity is possible here. In the prior art beam splitters inside ring resonators are used to simply enhance one direction of travel over the other. Technically speaking the connection of input and output channels with the gain and the feedback element is inverted; and, As opposed to the prior art here the mixer element is not only in charge of coupling out the light for use and/or diagnostics but it intrinsically determines the relative strength of the directions of emission.

BRIEF DESCRIPTION OF THE DRAWINGS

For a better understanding of the invention reference may be made to the accompanying drawings exemplary of the invention in which:

FIG. 2A is a schematic diagram of a simple embodiment of the invention. The two beams 4 that exit the gain material 1 through facet 16 are being recombined by the mixer 7 into beams 8 and 14. One of them hits the feedback element 9. The usable light consists of beams 10 and 14;

FIG. 2B is a schematic diagram of a variant of the embodiment shown in FIG. 2A which is preferable for solid state lasers, particularly if mirrors 12 and/or 9 are curved;

FIG. 3A is a schematic diagram of an embodiment in which beam splitter 17 operates sensitive to polarization, it is possible to easily vary the degree of feedback and the degree of outcoupling by orienting the phase plates 13 and 18 relative to the main axis of the mixer 17. Thereby the intensities of beams 10 and 14 can be influenced;

FIG. 3B is a schematic diagram of an alternative arrangement of that shown in FIG. 3A;

FIG. 5A is a schematic diagram of a very simple and preferred embodiment for semiconductor lasers consisting of a single prism which has angles that are optimized with respect to its index of refraction so that incidence on face 9 is normal. It carries highly or partly reflecting coatings 7, 9, and 11. The mirror 9 acts as outcoupling element for the usable light 10;

FIG. 5B is a schematic diagram of the embodiment shown in FIG. 5A with the exception that the mirror 7 acts as outcoupler for the usable light 14;

FIG. 6A is a schematic diagram of the embodiment as shown in FIG. 5A with an optional usage of light 14 or 9; and, FIG. 6B is a schematic diagram of an alternative variant with a prism that possesses an internal beam splitter.

DESCRIPTION OF THE PREFERRED EMBODIMENTS

Figure 1A:
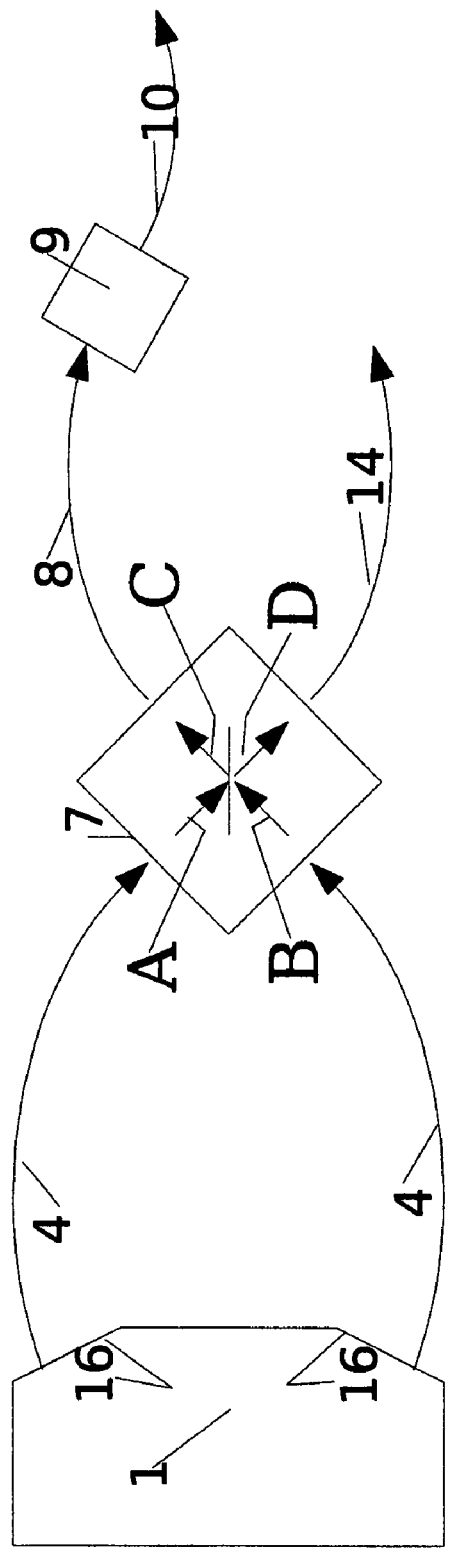
FIG. 1A is a schematic diagram of a preferred embodiment of the invention where a gain region 1 emits at least two beams 4 which enter through input channels A and B of a mixing element 7. Output channel C of the mixer emits light 8 towards a feedback element 9. Typically either beam 10 or a partial beam 14 is being outcoupled for the usable light.
Figure 1B:
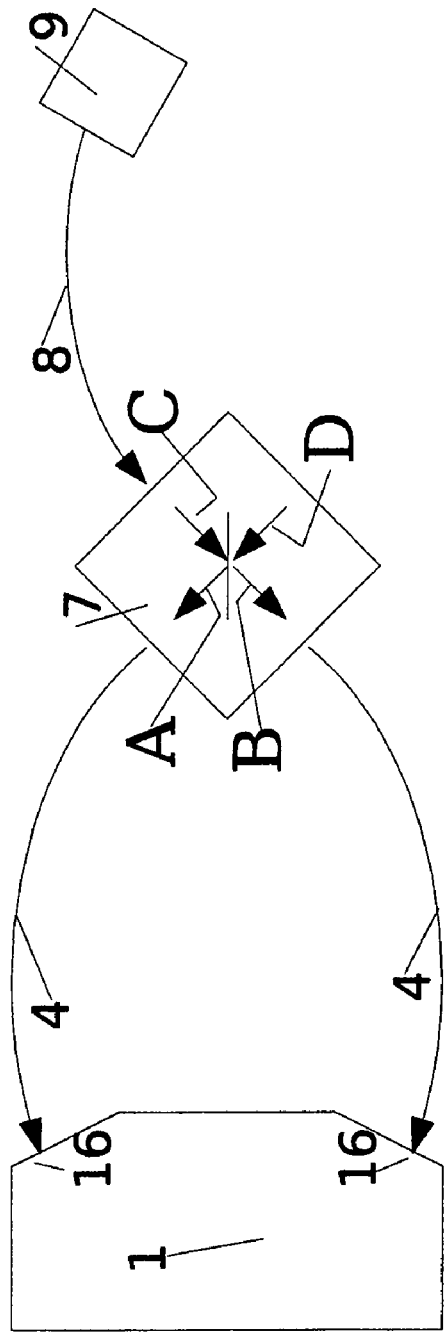
FIG. 1B is a schematic diagram of a preferred embodiment where the light 8 that returns from the feedback element 9 enters through channel C and is distributed onto channels A and B.

A principal depiction of the concept of the laser resonator of the present invention is given in FIG. 1A which shows the light path from the gain 1 to the feedback element 9. FIG. 1B indicates the reverse. The gain 1 material is characterized by its ability to react with stimulated emission to feedback. It may be a setup or arrangement with or without its own resonator. That means that in the following paragraphs generally no distinction is made between setups that are externally forced to resonate at a given laser emission, usually called "seeding" or regenerative amplifier, and setups in which the resonators are completed only by the external feedback. If a distinction with respect to the gain 1 is made at all, then the former will be called "laser" and the latter "semi-open laser" to emphasize the fact that the latter is missing feedback on one side. A laseractive gain 1 possesses at least one surface 16 through which at least two different beams 4 can couple in and out. For the functioning of the present invention, it is of no importance whether the two beams are "real" beams or whether they consist of two different angular regions of a single broad beam. This is noteworthy as in many practical cases a clear distinction cannot be made. Central element of the laser resonator according to the invention is the beam splitting mixer element 7 which in FIG. 1A distributes two input channels A and B onto two output channels C and D and which in FIG. 1B distributes a single feedback beam 8 in channel C onto the two feedback channels A and B. For suitable input signals A and B, the beam splitter can be chosen such that one of the two output channels—preferably D—does not carry any power. For this case the whole power that was emitted by the gain 1 into two channels 4 is combined in a single beam 8. Feedback and outcoupling of the usable light 10 can be realized with element 9, preferably a partly reflecting mirror or grating. Due to the symmetry of the mixing beam splitter in FIG. 1B, the functioning of the channels A/B and C/D are reversed for the feedback beam 8. This means that light entering through C is distributed according to the splitting ratio onto channels A and B before it returns to the gain 1 to participate in stimulated emission.

The beam splitter 7 is preferably a partly reflecting element like a mirror, grating, polarizing beam splitter, diffractive optic, holographic element, or the like. It has a reflectivity R and a transmission T=1−R. If it is illuminated by a beam A of field amplitude $E_A$ two partial beams C and D with amplitudes $E_{CA}=a_{CA}*E_A$ and $E_{DA}=a_{DA}*E_A$ result. Correspondingly the partial beam B with amplitude $E_B$ results in two beams C and D with $E_{CB}=a_{CB}*E_B$ and $E_{DB}=a_{DB}*E_B$, respectively. The coefficients $a_{CA}$, $a_{DA}$, $a_{CB}$, and $a_{DA}$ are the elements of a unitary matrix which have a magnitude SQRT(R), where SQRT stands for square root, and SQRT(1−R) and carry a suitable phase to fulfill energy conservation. The two respective beam amplitudes $E_{CA}=a_{CA}*E_A$ and $E_{CB}=a_{cB}*E_B$, respectively $E_{DA}=a_{DA}*E_A$ and $E_{CB}=a_{DB}*E_B$ do interfere with one another which results in constructive and destructive effects and a change in the ratio of optical power.

A few cases are of specific interest. Particularly the one with identical intensities and phases in both beams 4 and a splitting ratio of R=T=50% which has the coefficients $a_{CA}=a_{DA}=a_{CB}=-a_{DB}=1/SQRT(2)$. This is the case in which the partial beam D does not carry any power. Also the light that returns from element 9 will be split into two feedback beams A and B with identical intensity. If the gain 1 is symmetrical, too, both beams 4 remain equally intense and without phase difference. For this case it is preferable to use the feedback element 9 as outcoupler. The outcoupling ratio can—in principle—be chosen freely. This scenario essentially remains intact if the splitting ratio of the mixer does not deviate much from 50% or 50:50. For that case a weak additional beam 14 results, which can be used for diagnostic purposes.

If, however, the splitting ratio deviates considerably from 50% an asymmetry in the feedback intensities results. This is interchanged by the gain element so that a relative power of 2*R*T results in beam 8 and a power of $(T−R)^2$ in beam 14. In this case it is preferable to make the feedback element 9 highly reflective and use the light of channel 14 as outcoupled power.

In most practical cases additional elements like lenses, prisms, and the like will be necessary for collimation, imaging, beam guidance, etc. They have been omitted in the sketches for the sake of simplicity despite their technical importance for the transverse characteristics of the light like beam waists, divergence, and modal stability.

The present invention provides a combination of improved output power and increased spatial and/or spectral quality. These advantages can be achieved without a considerable complication of the resonators. In the following some embodiments will be presented, that comprise only three optical components: laserchip, collimation lens, and feedback prism. Particularly the symmetry in the emission channels is advantageous if high-gain materials allow for a high degree of outcoupling. Otherwise amplified spontaneous emission increases and the risk of undesired parasitic laser modes goes up.

In the preferred embodiments preferably no direct exchange of radiation between the different channels of emission takes place. Instead radiation is only exchanged after a passage through mixer and feedback elements. The latter preferably being configured as partly reflecting outcoupling element. By this means it is enforced that no resonator mode tends to oscillate, just because it does not suffer resonator losses or in other words all laser modes that oscillate also contribute to the outcoupling light via the outcoupling element.

Particularly for semiconductor lasers and especially for those with sub-structured gain region as disclosed in German publications DE 43 38 606 and DE 36 11 167 such embodiments are advantageous because it is well known that they possess multiple preferred directions of emission.

Also for cases with optically pumped lasers such embodiments are advantageous, because a pump configuration comprising more than one coherent beam leads to interference patterns, that is, periodic modulations in the resulting gain. Consequently, more than one direction of emission results from the interference conditions. They can, thus, be treated according to the proposed invention. That way an improved control over the modal behavior of the laser can be achieved by the mutual arrangement of pump laser and secondary laser.

In solid state lasers the asymmetry that results from the fact that only one side of the gain material is used for outcoupling while the other end has highly reflecting optical elements can be eliminated. A two-sided outcoupling can increase the average field amplitude inside the gain material which in turn improves the efficiency and spectral behavior of the laser.

The preferred or advantageous embodiments of the present invention are applicable for a large number of different types of lasers, independent of the gain material. Particularly possible are setups with more than one gain region that may or may not be connected.

In FIGS. 2A and 2B two different simple embodiments are depicted. FIG. 2A shows a setup which is suitable for high-power semiconductor lasers. The gain region 1, which preferably is coated with a highly reflective feedback layer 2 on its back face, emits two beams 4 under different angles through its front face 16. One beam is redirected by a mirror 12. The two beams hit a beam splitter 7, a semitransparent mirror in this case, on opposite sides. The angles of incidence are chosen such that one reflected partial beam and one transmitted partial beam overlap as much as possible and thus together build up beam 8. This beam 8 hits the feedback mirror 9 which preferably is semitransparent. Depending on all components, there may or may not emanate an additional beam 14. Correspondingly, the usable light can be taken from beam 10 and/or beam 14, or even be extracted at different places by additional outcoupling elements. FIG. 2B is a possible embodiment for solid state lasers in which the two beams exiting through faces 16 are preferably redirected by curved mirrors 12 onto the mixing beam splitter 7. It is preferable that both optical paths from the gain to the mixer have the same length or at least all beam characteristics like beam diameter, Rayleigh-range, divergence, beam quality, etc. are identical. This enhances the quality of the interference of the beams. Otherwise, the beam characteristics of the two beams emanating from the splitter differ which should be taken into account by the application.

An embodiment in which the splitting ratio can easily be adjusted is shown in FIGS. 3A and 3B. One possible arrangement is shown in FIG. 3A and another possible realization is shown in FIG. 3B. Here, the beam splitter 17 is assumed to be polarization sensitive. Relative splitting and degree of feedback can be adapted by rotating the phase retarders 13 and 18 with respect to the axis of the beam splitter.

Figure 4A:
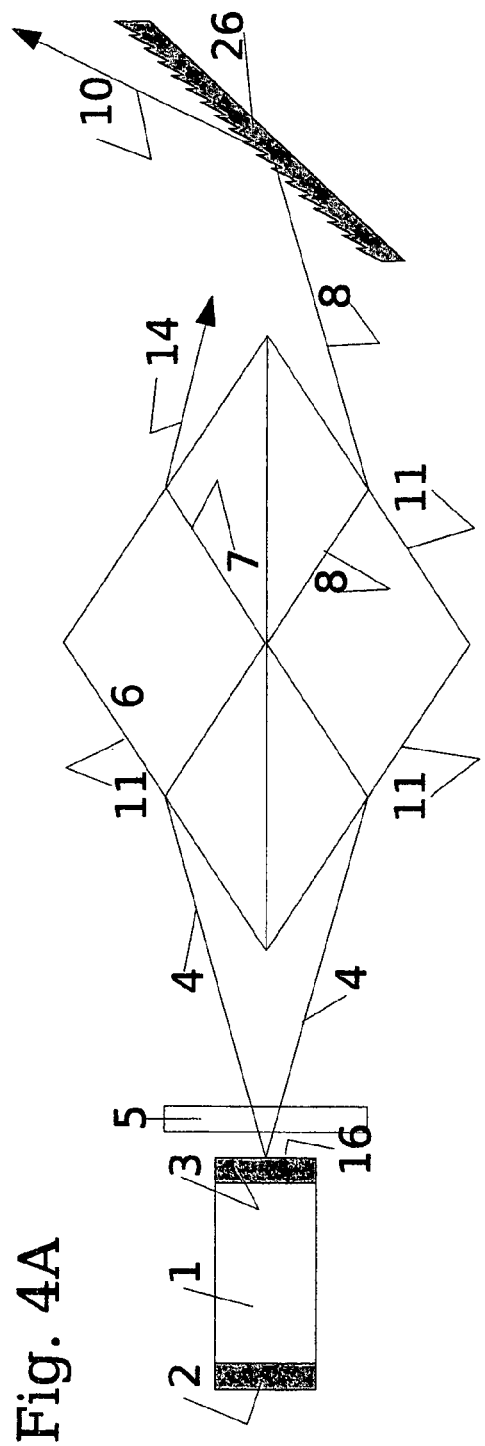
FIG. 4A is a schematic diagram of a preferred embodiment for semiconductor lasers where the active material 1 emits two beams 4 which are united by a beam splitter 7 into one beam 8. Feedback and outcoupling is achieved by elements 26 or 9 to generate the usable light 10. Preferably the collimators 5 and a mirror 12 are added. Preferably surfaces 3 and/or 11 are anti-reflectively coated or the Brewster condition is fulfilled.
Figure 4B:
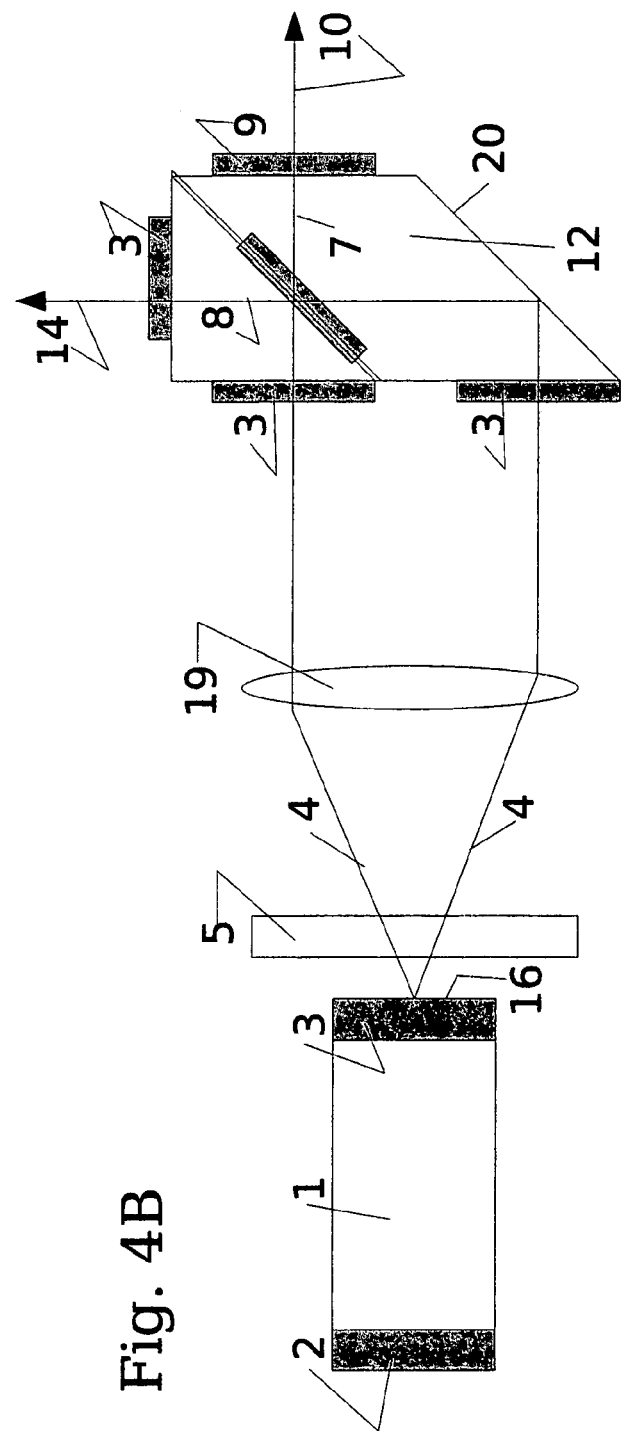
FIG. 4B is a schematic diagram of an embodiment as shown in FIG. 4A augmented by a collimating element 19 and monolithic integration of mirrors 7, 9, and 12.

FIGS. 4A and 4B show two preferred embodiments for semiconductor lasers. The gain medium 1 emits two beams 4 which are united into one beam 8 by the beam splitter 7. Feedback and outcoupling happens via element 26 in FIG. 4A and via element 9 in FIG. 4B so that usable light 10 and 14 becomes available. In FIG. 1A the feedback is achieved by means of a grating in Littrow-arrangement so that outcoupling can happen through the zeroth order of diffraction. Preferably some collimators 5, antireflective coatings 3 and 11, and mirrors 12 are added to the setup. Preferably the grating is inserted such that the dispersion and wavelength-selectivity happens along the so-called fast axis perpendicular to the planes of epitaxy. In this case the combination of grating, fast-axis-collimator 5, and semiconductor waveguide acts as a strong filter on the wavelength. The anti-reflecting behavior can easily be achieved by obeying the Brewster condition. In FIG. 4B the setup is augmented by a collimating lens 19 which collimates the beam along the so-called slow-axis parallel to the planes of epitaxy. Additionally all mirrors 7, 9, and 12 have been monolithically integrated into one element 20 which preferably carries AR, that is, antireflective, -coatings 3.

In FIGS. 5A and 5B the use of a special prism 6 is depicted which is adapted to the angles of emission of the gain region 1. The difference between FIG. 5A and FIG. 5B consists in the outcoupling mechanism. In FIG. 5A the outcoupled light comes from the feedback element 9 and in FIG. 5B it comes from the beam splitter 7. This can be achieved by carefully choosing the reflectivities of the two mirrors according to the above-described splitting-ratio. The rest of the optical paths is identical for both cases: the light 4 that comes from the gain 1 which is coated with AR 3 and mirror 2 is preferably being collimated by a lens 5, for example a fast-axis-collimator. A precondition for correct functioning is the normal, that is, at a right angle, incidence of the light beam 8 upon the feedback element 9. The angle between the semitransparent face 7 and element 9 together with the index of refraction determine the angle of propagation of beam 21 towards the gain 1 and the angles of beams 22 and 23. By variation of the remaining angle of prism-face 25 the angle of beam 24 can be influenced and thus be adapted to the angle between the two beams 4 which is determined and fixed by the gain. If it is desired to cross face 25 under the Brewster-angle to save the antireflective coating 11 this imposes an additional condition on the angle between 7 and 9 which, thus, uniquely determines the prism 6 angles. This configuration can be adapted for a certain range of angles between beams 4. For other ranges different prisms with additional total internal reflections need to be chosen. Advantageous in all these cases is the simplicity and cost-effectiveness for production. They are based upon the fact that apart from the gain material 1 only a collimating lens 5 and a prism 6 with two partly reflecting coatings 7 and 9 are necessary if the concepts of unstable resonators are used. If a stable resonator is desired, only one additional lens for collimation along the slow axis is necessary.

All these embodiments are particularly advantageous in combination or extension of the unstable resonators of German publication DE 101 61 076. This is due to the fact that stripe-array lasers intrinsically show two expressed directions of emission. As it is also well known that unstable resonators work well on them it becomes possible to eliminate the remaining disadvantage, namely the uncontrollable power distribution in the two directions, by this invention.

The invention can be used for arbitrary gain materials. Particularly advantageous are—apart from semiconductors—all arrangements that possess more than one direction of emission, whether intrinsically or due to the setup of the pump geometry. This includes optically pumped gain media if the pumping light comprises more than one coherent and thus interfering partial beams.

Most of the proposed embodiments are suitable for arrays of single lasers, too. In many cases not even separate resonators are necessary, but instead the external resonator can be designed to have all single emitter operating in a common resonator.

It shall be emphasized that in all previously described embodiments the gain region may equally well consist of lasers that are operated as regenerative amplifiers or of semi-open lasers for which an external feedback is essential for laser operation. For both cases the proposed invention is advantageous.

What is claimed is:

1. A laser resonator comprising:
    a. at least one gain region with at least two different channels of emission through which it emits and receives radiation;
    b. at least one feedback element;
    c. at least one beam splitter,
        i. including at least two input channels optically connected to different emission channels of the at least one gain region and said beam splitter for sending at least part of the incident light through a common output channel towards said feedback element,
        ii. for distributing light coming from said feedback element at least onto said two input channels of said at least one gain region, irrespective of the emission channel the light originated from,
        iii. whereby said beam splitter operates as a mixer element between said emission/reception channels of said gain region.

2. The laser resonator according to claim 1, wherein said at least one gain region includes one of the following media:
    a. a semiconductor,
        i. including at least one of Ridge-, distributed feedback-, distributed-bragg-reflector-, tapered-, broad-area-, stripe array-, and vertically emitting geometry,
        ii. including at least one of with reflective coating on its back facet and without reflective coating on its back facet,
        iii. including at least one of with antireflective coating on its front facet and without antireflective coating on its front facet;
    b. a solid state laser gain material having at least one of rod, slab, and disc geometry;
    c. a polymer;
    d. a liquid;
    e. a gas.

3. The laser resonator according to claim 1, wherein said at least one gain region contains a periodically modulating physical parameter inside said gain region of the laser material to result in said at least two channels of emission.

4. The laser resonator according to claim 1, wherein said feedback element has a setup including at least one of the following:
    a. at least one of a totally reflective mirror and a partially reflecting mirror,
    b. a grating,
    c. at least one of a holographic optical element and a diffractive optical element,
    d. a phase conjugating element,
    e. a wavelength selective optical setup comprising gratings, lenses, prisms, etalons.

5. The laser resonator according to claim 1, wherein said feedback element has at least one of the following characteristics:
    a. said feedback element is curved,
    b. said feedback element is carried by at least one of a lens, lenses, a mirror, and mirrors,
    c. said feedback element is microstructured,
    d. said feedback element includes curved gratings,
    e. said feedback element is at least one of a diffractive element and holographic element, f. said feedback element has a varying index of refraction, whereby said feedback element has beam shaping properties due to at least one of said characteristics.

6. The laser resonator according to claim 1, wherein said beam splitter is for functioning as a mixer element and said beam splitter comprising at least one of the following:
   a. a partly reflective mirror,
   b. a polarization beam splitter,
   c. a dielectric multilayer structure,
   d. at least one of a holographic optical element and diffractive optical element,
   e. a setup for achieving a partial reflectivity by so-called frustrated total internal reflection.

7. The laser resonator according to claim 1, wherein the splitting ratio of said mixer element and said feedback element is at least one of the following:
   a. said mixer element has a splitting ratio of about 50:50 and said feedback element has arbitrary reflectivity,
   b. said mixer element has a splitting ratio substantially differing from a ratio of 50:50 and said feedback element has a high reflectivity up to 100%.

8. The laser resonator according to claim 1, wherein said mixer element has at least one of the following characteristics:
   a. the optical paths of the two channels of emission have the same length,
   b. and the beam parameter of at least two beams are substantially alike at said mixing element.

9. The laser resonator according to claim 1, wherein said resonator further comprises at least one of the following optical elements between said gain region and said feedback element:
   a. collimation lenses which are at least one of spherical, aspherical and cylindrical,
   b. phase retardation elements,
   c. telescopes,
   d. optical elements including prisms, mirrors, gratings, lenses, free space propagation.

10. The laser resonator according to claim 1, wherein
   a. said gain region is at least one of broad area laser and a stripe array, and,
   b. said resonator is unstable in at least one direction.

11. The laser resonator according to claim 1, wherein said resonator has an integrated monolithic structure element, and said monolithic integrated element includes a mixer element, a feedback element, and beam propagation means.

12. The laser resonator according to claim 11, wherein the surfaces of said monolithic structure element has at least one of the following:
   a. said surfaces are covered with reflective layers to deliver predetermined splitting ratios,
   b. the surfaces are incident under Brewster angle,
   c. the surfaces are inclined suitably with respect to the direction of incidence, to operate as a beam deflector.

13. The laser resonator according to 12, wherein said monolithic element is a prism having the following:
   a. one face for operating as a feedback element,
   b. a second face for operating as a beam splitter, and,
   c. a third face for operating as a deflector.

14. The laser resonator according to claim 12, wherein said monolithic element is a prism having the following,
   a. two faces that are hit under identical angles by the light of two different directions of emission,
   b. a beam splitter inside said prism, said beam splitter for being hit by said two channels of emissions substantially at the same spot and substantially under identical angles, and
   c. a third face for operating as a feedback element, said third face having a shape such that the beam that results from said two channels of emissions hitting said third face results in said third face operating as feedback element under normal incidence.

15. The laser resonator of claim 1, wherein said laser resonator comprises a multitude of laser resonators wherein single laser beams are superimposed by at least one of coherently and incoherently by means of spectral multiplexing.

* * * * *